US010252522B2

(12) United States Patent
Hiwada

(10) Patent No.: US 10,252,522 B2
(45) Date of Patent: Apr. 9, 2019

(54) LIQUID EJECTING APPARATUS

(71) Applicant: BROTHER KOGYO KABUSHIKI KAISHA, Nagoya-shi, Aichi-ken (JP)

(72) Inventor: Shuhei Hiwada, Toyoake (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 15/910,239

(22) Filed: Mar. 2, 2018

(65) Prior Publication Data

US 2018/0281388 A1 Oct. 4, 2018

(30) Foreign Application Priority Data

Mar. 28, 2017 (JP) ................ 2017-062988

(51) Int. Cl.
*B41J 2/045* (2006.01)
*H01L 41/09* (2006.01)
*H01L 41/04* (2006.01)
*H01L 41/047* (2006.01)

(52) U.S. Cl.
CPC ......... *B41J 2/04541* (2013.01); *B41J 2/0452* (2013.01); *B41J 2/04548* (2013.01); *B41J 2/04581* (2013.01); *B41J 2/04588* (2013.01); *H01L 41/042* (2013.01); *H01L 41/0475* (2013.01); *H01L 41/0973* (2013.01)

(58) Field of Classification Search
CPC ............... B41J 2/04541; B41J 2/04588; B41J 2/04548; B41J 2/0452; H01L 41/0973; H01L 41/0475; H01L 41/042
See application file for complete search history.

(56) References Cited

U.S. PATENT DOCUMENTS

2001/0026292 A1* 10/2001 Ishizaki ............... B41J 2/04541
347/12
2003/0146954 A1 8/2003 Tamura

FOREIGN PATENT DOCUMENTS

JP 2003-226006 A 8/2003

* cited by examiner

*Primary Examiner* — Julian D Huffman
(74) *Attorney, Agent, or Firm* — Scully, Scott, Murphy & Presser, PC

(57) ABSTRACT

A liquid ejecting apparatus includes a liquid ejection head, a plurality of amplifiers, and a plurality of signal line sets. The liquid ejection head has a plurality of actuators. The plurality of amplifiers is configured to amplify driving signals supplied to each of the plurality of actuators. The plurality of signal line sets is provided for respective ones of the plurality of amplifiers. Each of the plurality of signal line sets includes a supply line and a return line. The supply line is configured to supply the driving signals amplified by a corresponding one of the plurality of amplifiers to the plurality of actuators. The return line is configured to return the driving signals to the corresponding one of the plurality of amplifiers. Each of the plurality of amplifiers is electrically floating.

18 Claims, 9 Drawing Sheets

FIG. 5

| | SIGNAL GENERATING CIRCUIT W1 SMALL-DROPLET DRIVING SIGNAL S1 | SIGNAL GENERATING CIRCUIT W2 MEDIUM-DROPLET DRIVING SIGNAL S2 | SIGNAL GENERATING CIRCUIT W3 LARGE-DROPLET DRIVING SIGNAL S3 | SIGNAL GENERATING CIRCUIT W4 NON-EJECTION DRIVING SIGNAL S4 |
|---|---|---|---|---|
| NUMBER OF PULSES DURING ONE EJECTION CYCLE | 1 | 1 | 2 | 4 |
| AMPLITUDE (VOLTAGE) OF PULSES | 24V | 24V | 24V | 12V |
| Tr, Tf | 1μsec | 3μsec | 3μsec | 1.2μsec |
| PEAK CURRENT (VALUE FOR MEDIUM DROPLET IS USED AS BENCHMARK) | 3 | 1 | 1 | 1.25 |
| POWER CONSUMPTION (VALUE FOR MEDIUM DROPLET IS USED AS BENCHMARK) | 1 | 1 | 2 | 1 |

LIQUID EJECTING APPARATUS

CROSS REFERENCE TO RELATED APPLICATIONS

This application claims priority from Japanese Patent Application No. 2017-062988 filed Mar. 28, 2017. The entire content of the priority application is incorporated herein by reference.

TECHNICAL FIELD

This disclosure relates to a liquid ejecting apparatus configured to amplify driving signals and to supply the driving signals to a plurality of actuators.

BACKGROUND

For example, it is disclosed that a driving signal generated by a head driving circuit is amplified by an electric-current amplifier circuit (amplifier) and is supplied to piezoelectric elements (actuators) of each nozzle array through a driving signal line (supply line) of a driving signal line and a ground signal line (a signal line set) provided for each nozzle array, and the driving signal is returned to the electric-current amplifier circuit through the ground signal line (return line) of the signal line set provided for each nozzle array.

SUMMARY

According to one aspect, this specification discloses a liquid ejecting apparatus. The liquid ejecting apparatus includes a liquid ejection head, a plurality of amplifiers, and a plurality of signal line sets. The liquid ejection head has a plurality of actuators. The plurality of amplifiers is configured to amplify driving signals supplied to each of the plurality of actuators. The plurality of signal line sets is provided for respective ones of the plurality of amplifiers. Each of the plurality of signal line sets includes a supply line and a return line. The supply line is configured to supply the driving signals amplified by a corresponding one of the plurality of amplifiers to the plurality of actuators. The return line is configured to return the driving signals to the corresponding one of the plurality of amplifiers. Each of the plurality of amplifiers is electrically floating.

BRIEF DESCRIPTION OF THE DRAWINGS

Embodiments in accordance with this disclosure will be described in detail with reference to the following figures wherein:

FIG. 5 is a table showing driving signals S1 to S4 generated by signal generating circuits W1 to W4, respectively;

DETAILED DESCRIPTION

In the above configuration, the signal line set is provided for each nozzle array, and driving signals are supplied to a plurality of actuators through the supply line of the signal line set. For this reason, pulse waves of many types needs to be included in the driving signals, and an ejection cycle becomes long.

In order to suppress the above problem, the inventor of this disclosure devised a configuration in which a plurality of amplifiers are provided, a signal line set is provided for each of the amplifiers, and driving signals amplified by the amplifiers are supplied to a plurality of actuators through the supply lines of the signal line sets corresponding to the amplifiers. However, in this configuration, when the plurality of amplifiers is electrically connected to the ground of the main power supply of a liquid ejecting apparatus, absolute values of current waveforms on a supply line and a return line of each of the signal line sets are not equal to each other, and an inductance increases.

An example of an object of this disclosure is to provide a liquid ejecting apparatus which suppresses an ejection cycle from becoming long and reduces an inductance.

First Embodiment

Figure 1:
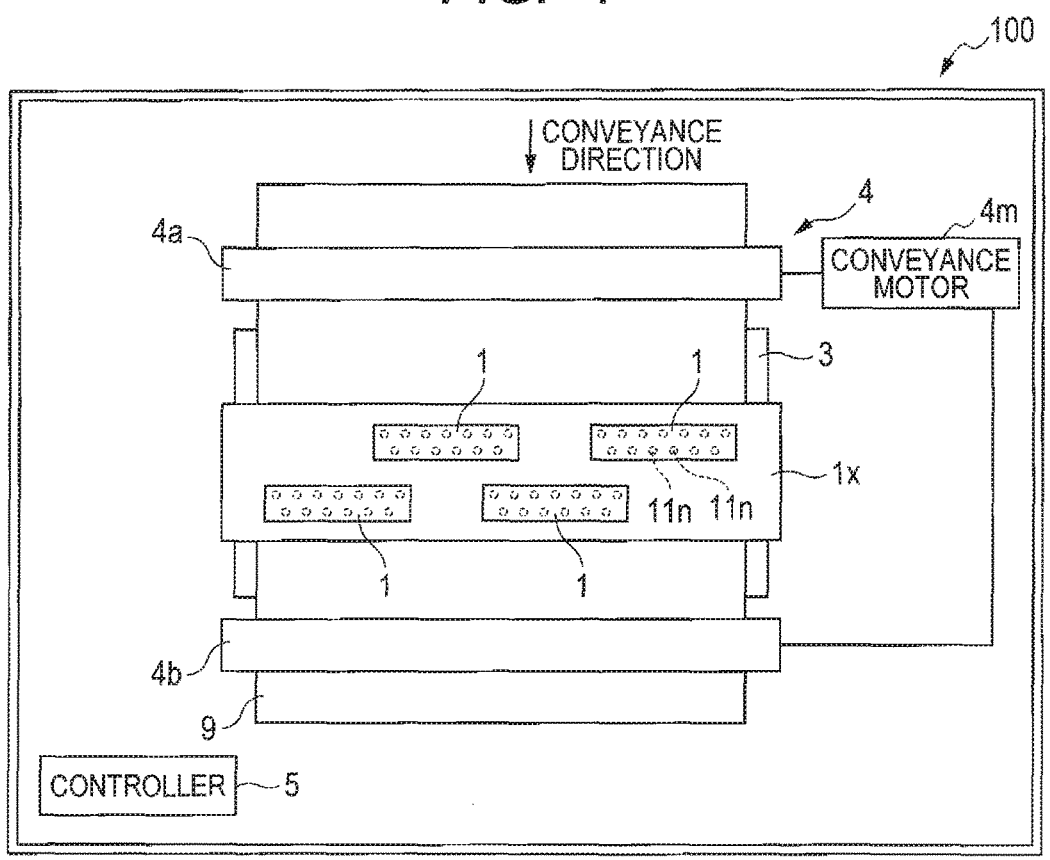
FIG. 1 is a schematic plan view of a printer 100 according to a first embodiment.

An overall configuration of a printer 100 according to a first embodiment of this disclosure will be described with reference to FIG. 1. The printer 100 is an example of a liquid ejecting apparatus according to this disclosure. The printer 100 includes a head unit 1x, a platen 3, a conveyance mechanism 4, and a controller 5.

The head unit 1x is of a line type (i.e., a type in which ink is ejected to a sheet 9 while the position of the head unit is fixed), and is elongated in a direction perpendicular to a conveyance direction. The head unit 1x includes four heads 1 arranged in a staggered form along the direction perpendicular to the conveyance direction. The four heads 1 have the same structure. Each of the heads 1 is an example of a liquid ejection head according to this disclosure, and ejects ink from a plurality of nozzles 11n.

The platen 3 is disposed below the head unit 1x. Ink is ejected from each of the heads 1 on the sheet 9 supported by the platen 3.

The conveyance mechanism 4 has two roller pairs 4a and 4b which are disposed while sandwiching the platen 3 in the conveyance direction. A conveyance motor 4m is driven to rotate two rollers constituting each roller pair 4a, 4b in opposite directions while the rollers nip the sheet 9, so that the sheet 9 is conveyed in the conveyance direction.

The controller 5 controls the four heads 1, the conveyance motor 4m, and so on based on a recording command input from an external device such as a PC such that an image is recorded on the sheet 9.

Figure 2:
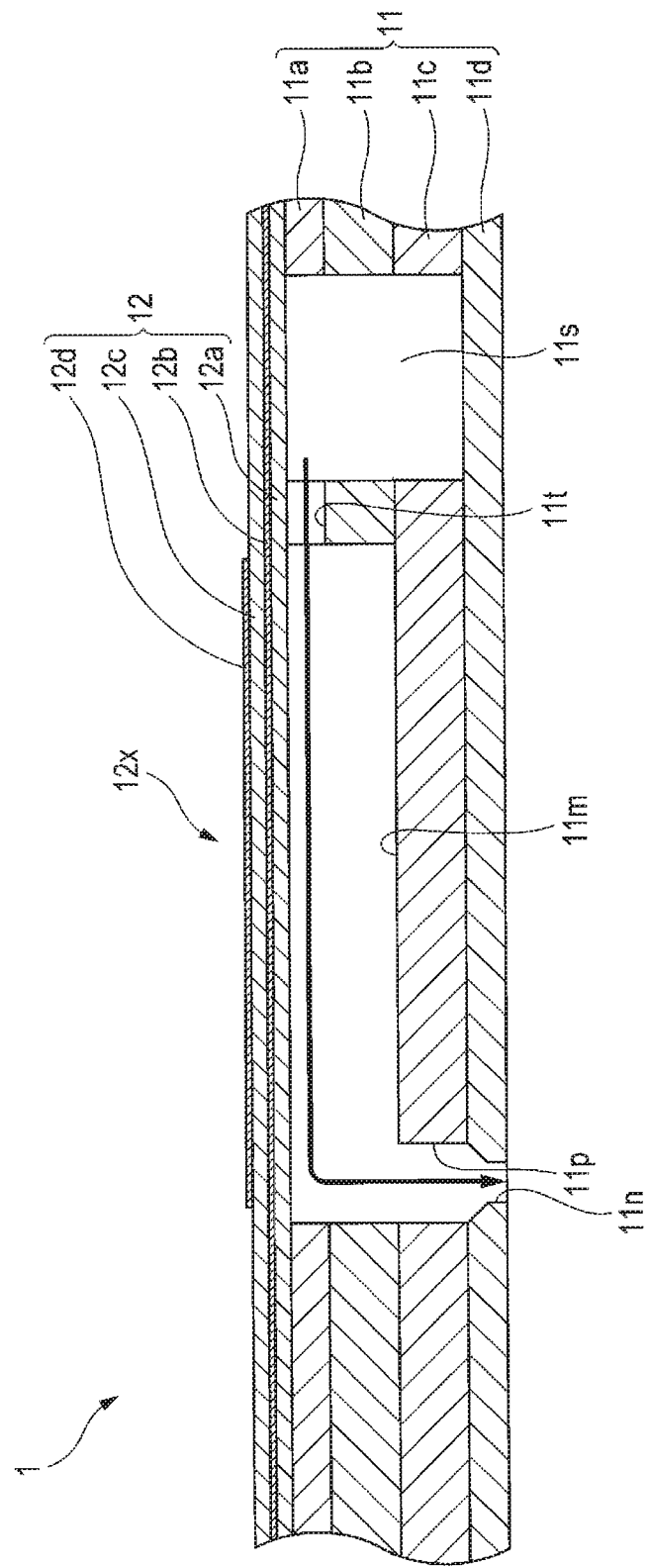
FIG. 2 is a cross-sectional view of a channel board of a head 1 provided in the printer 100.

The configuration of the head 1 will be described below with reference to FIG. 2.

The head 1 has a channel board 11 and an actuator unit 12.

The channel board 11 has four plates 11a to 11d and is constituted by bonding the four plates 11a to 11d to each other. In the plate 11a, an upper part of a pressure chamber 11*m*, an upper part of a supply channel 11*s*, and an aperture diaphragm 11*t* are formed to penetrate the plate 11*a*. In the plate 11*b*, a lower part of the pressure chamber 11*m* and a vertically central part of the supply channel 11*s* are formed to penetrate the plate 11*b*. In the plate 11*c*, a lower part of the supply channel 11*s* and a descender 11*p* connecting the pressure chamber 11*m* and a nozzle 11*n* are formed to penetrate the plate 11*c*. In the plate 11*d*, the nozzle 11*n* is formed to penetrate the plate 11*d*.

The plurality of nozzles 11*n* opens on a lower surface (lower surface of the plate 11*d*) of the channel board 11, and the plurality of pressure chambers 11*m* opens on an upper surface (upper surface of the plate 11*a*) of the channel board 11. The plurality of pressure chambers 11*m* is in communication with the plurality of nozzles 11*n*, respectively.

The supply channel 11*s* is in communication with a tank (not shown) reserving ink through a tube or the like. The ink in the tank is supplied to the supply channel 11*s* by driving a pump (not shown) and then supplied to the pressure chambers 11*m*.

The actuator unit 12 is disposed on the upper surface of the channel board 11 to cover the plurality of pressure chambers 11*m*. The actuator unit 12 includes a vibration plate 12*a*, a common electrode 12*b*, a piezoelectric layer 12*c*, and a plurality of individual electrodes 12*d* in this order from the bottom. The vibration plate 12*a*, the common electrode 12*b*, and the piezoelectric layer 12*c* are arranged to cover the plurality of pressure chambers 11*m* (i.e., arranged over the plurality of pressure chambers 11*m*). In contrast to this, the plurality of individual electrodes 12*d* is arranged to oppose (face) the plurality of pressure chambers 11*m*, respectively (for each pressure chamber 11*m*). The potential of the common electrode 12*b* is kept at the ground potential. More specifically, the common electrode 12*b* is a ground electrode common to the plurality of nozzles 11*n*.

On the vibration plate 12*a* and the piezoelectric layer 12*c*, parts sandwiched by the individual electrodes 12*d* and the pressure chambers 11*m* function as actuators 12*x* which deform in response to application of a voltage to the individual electrodes 12*d*. More specifically, the actuator unit 12 has the plurality of actuators 12*x* opposing the plurality of pressure chambers 11*m*, respectively. With driving of the actuators 12*x* (i.e., the actuators 12*x* deform in response to application of a voltage to the individual electrodes 12*d* (for example, to be made convex toward the pressure chambers 11*m*), the pressure chambers 11*m* change in volume and the ink in the pressure chambers 11*m* is pressured to eject the ink from the nozzles 11*n*.

An electric configuration of the printer 100 will be described below with reference to FIG. 3 to FIG. 7. Although FIG. 3 shows only one head 1, the four heads 1 are connected to the controller 5 in the same manner.

Figure 3:
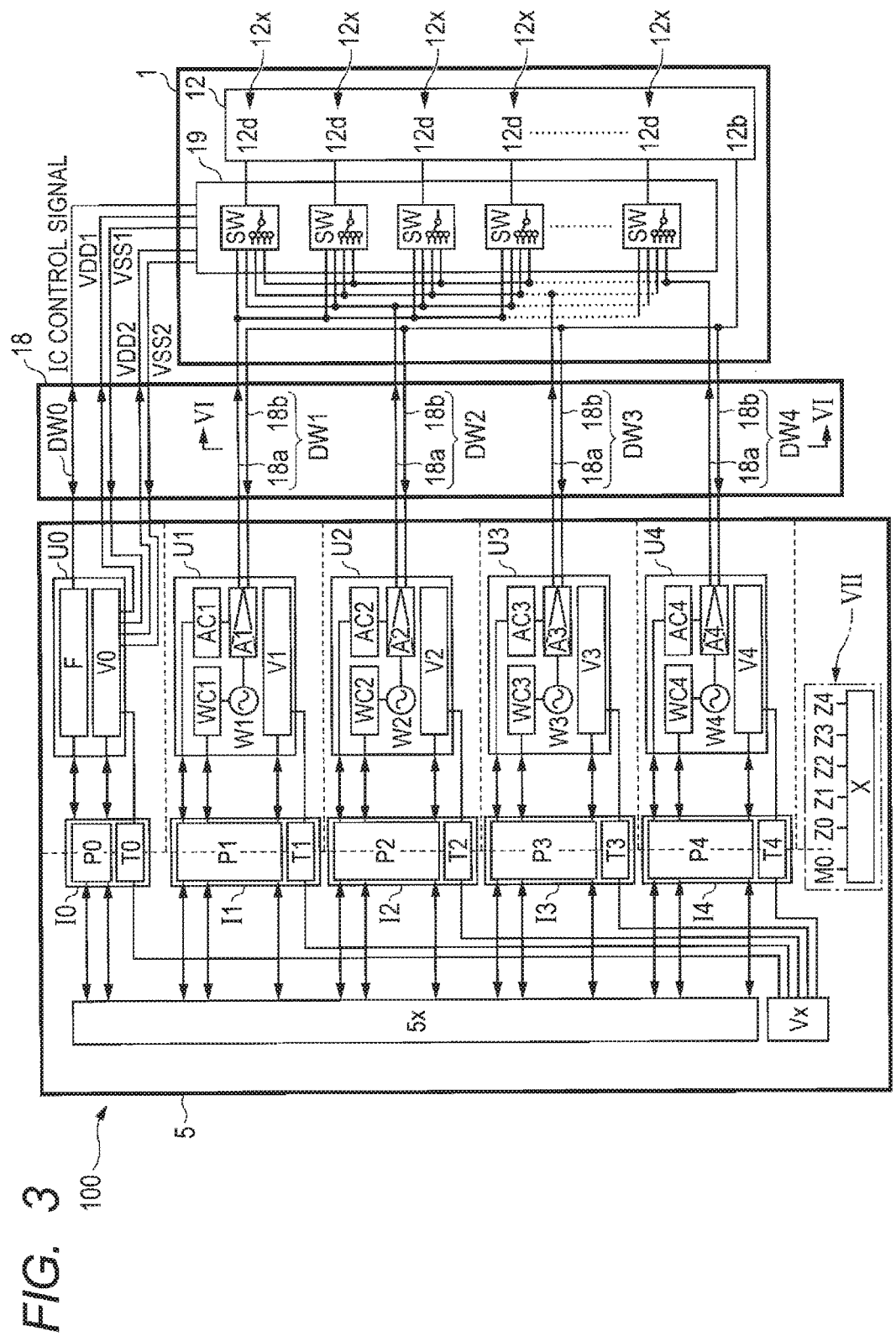
FIG. 3 is a circuit diagram showing an electric configuration of the printer 100.

As shown in FIG. 3, each of the heads 1 has a driver IC 19. The driver IC 19 is electrically connected to each actuator 12*x* of the actuator unit 12 and to the controller 5 through an FFC (Flexible flat cable) 18.

The printer 100 has a main power supply Vx serving as a power supply source to each part of the printer 100. The main power supply Vx is mounted on the controller 5 and is connected to ground.

The controller 5 includes a control circuit 5*x*, five insulating circuits I0 to I4, five circuit units U0 to U4, and a connection circuit X.

The circuit unit U0 includes an IC control circuit F and a subsidiary power supply V0.

The IC control circuit F controls the driver IC 19. The IC control circuit F inputs/outputs a control signal and a status signal for controlling the driver IC 19, as IC control signals, from/to the driver IC 19 based on signals from the control circuit 5*x*. The IC control signals include a transfer clock signal CLK, a serial input signal SIN, a strobe control signal STB, and so on. The IC control signals are inputted from or outputted to the driver IC 19 through a wiring line DW0 of the FFC 18.

The subsidiary power supply V0 supplies electric power supplied from the main power supply Vx to the IC control circuit F and the insulating circuit I0. The subsidiary power supply V0 supplies particular drive potentials VDD1 (for example, 24 V), VSS1, VDD2 (for example, 12 V), and VSS2 to the driver IC 19.

The circuit units U1 to U4 include signal generating circuits W1 to W4, amplifiers A1 to A4, signal generating circuit controllers WC1 to WC4, amplifier controllers AC1 to AC4, and subsidiary power supplies V1 to V4, respectively.

The signal generating circuits W1 to W4 generate driving signals to be supplied to the plurality of actuators 12*x* by D/A conversion, based on a signal supplied from the control circuit 5*x*. The signal generating circuits W1 to W4 generate driving signals having waveforms different from each other.

Figure 4:
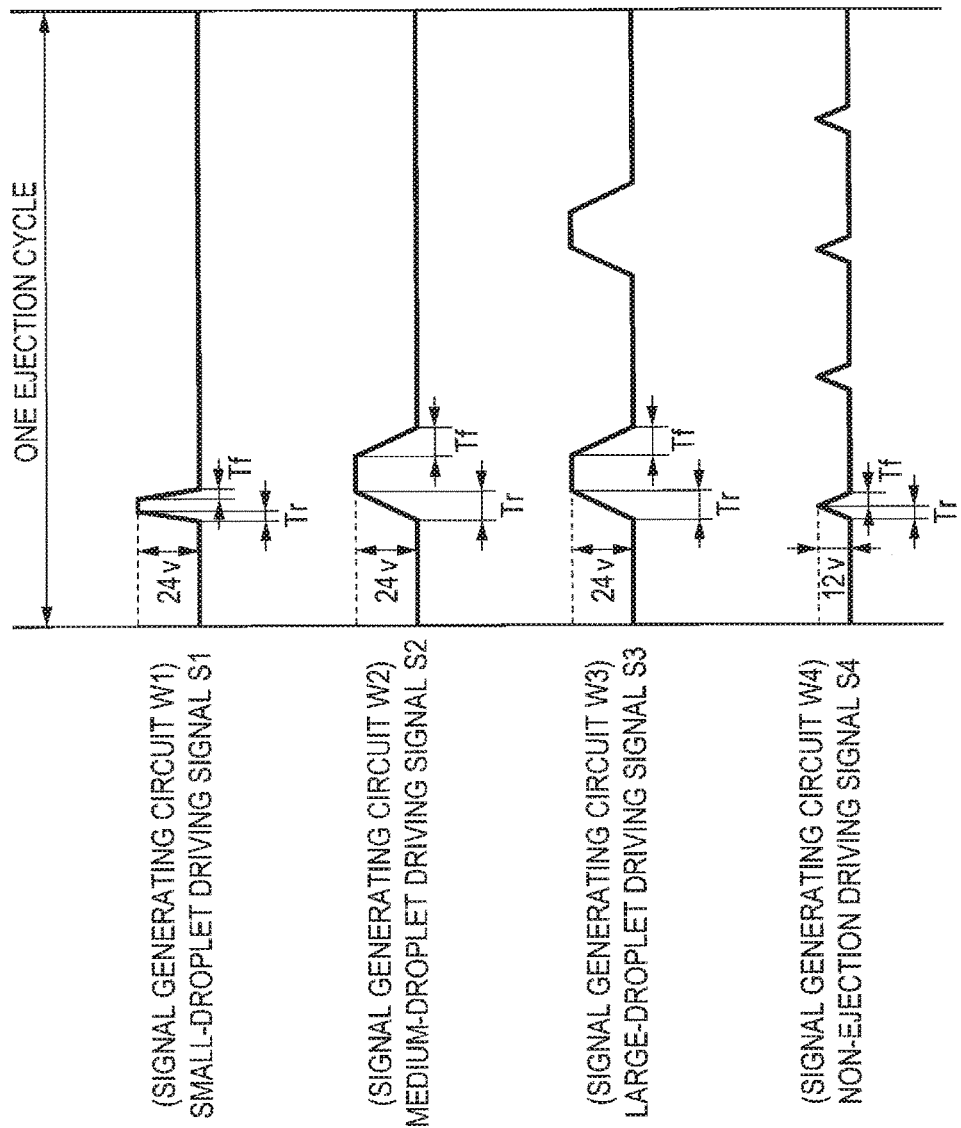
FIG. 4 is a graph showing driving signals S1 to S4 generated by signal generating circuits W1 to W4, respectively.

More specifically, as shown in FIG. 4 and FIG. 5, the signal generating circuit W1 generates a small-droplet driving signal S1 for ejecting a small ink droplet. The signal generating circuit W2 generates a medium-droplet driving signal S2 for ejecting a medium ink droplet. The signal generating circuit W3 generates a large-droplet driving signal S3 for ejecting a large ink droplet. The signal generating circuit W4 generates a non-ejection driving signal S4 for ejecting no ink droplet.

The small-droplet driving signal S1 includes one pulse in one ejection cycle and ejects one ink droplet (small ink droplet). The medium-droplet driving signal S2 includes one pulse (pulse having a pulse width larger and Tr and Tf longer than those of the pulse of the small-droplet driving signal S1) in one injection cycle and ejects one ink droplet (medium ink droplet). The large-droplet driving signal S3 includes two pulses (pulses similar to the pulse of the medium-droplet driving signal S2) in one injection cycle and ejects two ink droplets (large ink droplet). The medium droplet has an ejection amount larger than the ejection amount of the small droplet, and the large droplet has an ejection amount larger than the ejection amount of the medium droplet. The amplitude (voltage) of the pulse of the small-droplet driving signal S1, the amplitude of the pulse of the medium-droplet driving signal S2, and the amplitude of the pulse of the large-droplet driving signal S3 are the same.

The non-ejection driving signal S4 includes four pulses in one ejection cycle and vibrates a meniscus of ink in the nozzle 11*n* without ejecting an ink droplet from the nozzle 11*n*. In this manner, the ink in the nozzle 11*n* is suppressed from being dried. The amplitude (12 V) of each pulse of the non-ejection driving signal S4 is smaller than the amplitude (24 V) of each pulse included in the other driving signals S1 to S3.

The medium-droplet driving signal S2 and the large-droplet driving signal S3 have pulses having the same Tr and Tf (3 μsec (microseconds)). The Tr and Tf (1 μsec) of the pulse of the small-droplet driving signal S1 are smaller than the Tr and Tf (3 μsec) of the pulses of the medium-droplet driving signal S2 and the large-droplet driving signal S3. The Tr and Tf (1.2 μsec) of the pulse of the non-ejection driving signal S4 are larger than the Tr and Tf (1 μsec) of the pulse of the small-droplet driving signal S1 and smaller than the Tr and Tf (3 μsec) of the pulse of each of the medium-droplet driving signal S2 and the large-droplet driving signal S3. When the Tr and Tf are smaller, the degree of steepness of the rising edge and the falling edge of a waveform is higher. More specifically, the small-droplet driving signal S1 has a degree of steepness higher than those of the medium-droplet driving signal S2 and the large-droplet driving signal S3. The non-ejection driving signal S4 has a degree of steepness lower than that of the small-droplet driving signal S1, and has a degree of steepness higher than those of the medium-droplet driving signal S2 and the large-droplet driving signal S3.

The Tr and Tf in each pulse are the same.

Peak currents related to the driving signals S1 to S4 are expressed as $C \cdot V/T$ (where C=capacitance of the actuator 12x, V=amplitude of a pulse, and T=Tr, Tf), and is in proportion to the degree of a rising edge and a falling edge of a pulse waveform. As shown in FIG. 5, the medium-droplet driving signal S2 and the large-droplet driving signal S3 have the same peak currents ("1" each when the peak current of the medium-droplet driving signal S2 is defined as "1"). The peak current ("3" when the peak current of the medium-droplet driving signal S2 is defined as "1") of the small-droplet driving signal S1 is larger than the peak currents ("1" each when the peak current of the medium-droplet driving signal S2 is defined as "1") of the medium-droplet driving signal S2 and the large-droplet driving signal S3. The peak current ("1.25" when the peak current of the medium-droplet driving signal S2 is defined as "1") of the non-ejection driving signal S4 is smaller than the peak current of the small-droplet driving signal S1 and larger than the peak currents ("1" each when the peak current of the medium-droplet driving signal S2 is defined as "1") of the medium-droplet driving signal S2 and the large-droplet driving signal S3.

A power consumption of each of the driving signals S1 to S4 is expressed as $C \cdot V^2 \cdot f \cdot N \cdot ch$ (where C=capacitance of the actuator 12x, V=amplitude of a pulse, f=frequency of a pulse, N=the number of pulses in one ejection cycle, and ch=the number of actuators 12x driven at the same time), and is in proportion to the number of pulses in one ejection cycle. As shown in FIG. 5, the small-droplet driving signal S1, the medium-droplet driving signal S2, and the non-ejection driving signal S4 have the same power consumptions ("1" each when the power consumption of the medium-droplet driving signal S2 is defined as "1"). The power consumption ("2" when the power consumption of the medium-droplet driving signal S2 is defined as "1") of the large-droplet driving signal S3 is larger than the power consumptions ("1" each when the power consumption of the medium driving signal S2 is defined as "1") of the small-droplet driving signal S1 and the medium-droplet driving signal S2.

The driving signals S1 to S4 are analog voltage signals.

The amplifiers A1 to A4 amplify electric power such that the driving signals S1 to S4 generated by the signal generating circuits W1 to W4 become signals suitable for driving of the actuators 12x.

Signal generating circuit controllers WC1 to WC4 control the signal generating circuits W1 to W4. The signal generating circuit controllers WC1 to WC4 input/output control signals and status signals for controlling the signal generating circuits W1 to W4 from/to the signal generating circuits W1 to W4, based on signals from the control circuits 5x.

The amplifier controllers AC1 to AC4 control the amplifiers A1 to A4. The amplifier controllers AC1 to AC4 input/output control signals and status signals for controlling the amplifiers A1 to A4 from/to the amplifiers A1 to A4, based on signals from the control circuits 5x.

The subsidiary power supplies V1 to V4 supply electric power supplied from the main power supply Vx to the signal generating circuits W1 to W4, the amplifiers A1 to A4, the signal generating circuit controllers WC1 to WC4, the amplifier controllers AC1 to AC4, and the insulating circuits I1 to I4, respectively.

Of the subsidiary power supplies V1 to V4, the subsidiary power supply V1 has the largest peak current output capability, the subsidiary power supplies V2 and V3 have the smallest peak current output capability, and the subsidiary power supply V4 has a peak current output capability larger than the peak current output capabilities of the subsidiary power supplies V2 and V3 and smaller than the peak current output capability of the subsidiary power supply V1. More specifically, of the subsidiary power supplies V1 to V4, the subsidiary power supplies V2 and V3 having the smallest peak current output capabilities are assigned to the amplifiers A2 and A3 amplifying the driving signals (the medium-droplet driving signal S2 and the large-droplet driving signal S3) having the smallest peak currents. Of the subsidiary power supplies V1 to V4, the subsidiary power supply V4 having the second smallest peak current output capability is assigned to the amplifier A4 amplifying the non-ejection driving signal S4. Of the subsidiary power supplies V1 to V4, the subsidiary power supply V1 having the largest peak current output capability is assigned to the amplifier A1 amplifying the driving signal (small-droplet driving signal S1) having the largest peak current.

As shown in FIG. 3, the FFC 18 has four signal line sets DW1 to DW4 provided for the four amplifiers A1 to A4, respectively. Each of the signal line sets DW1 to DW4 includes a supply line 18a and a return line 18b. The supply line 18a is a line for supplying the driving signals S1 to S4 amplified by the corresponding amplifiers A1 to A4 to the plurality of actuators 12x. The return line 18b is a line for returning the driving signals S1 to S4 to the corresponding amplifiers A1 to A4. One end of the supply line 18a and one end of the return line 18b are connected to the amplifiers A1 to A4.

Figure 6:
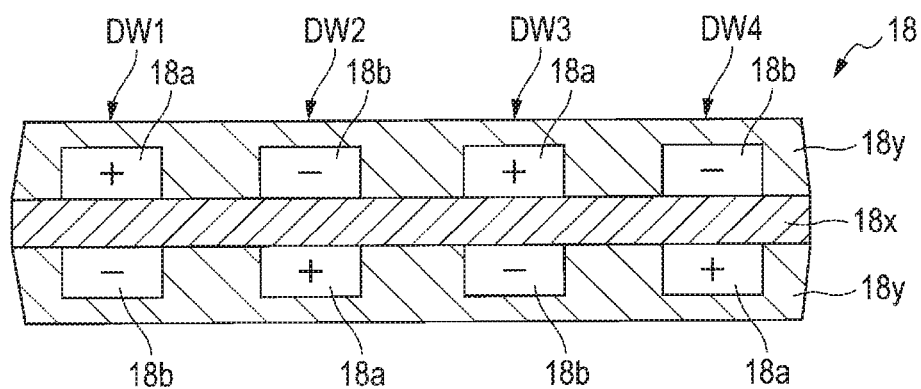
FIG. 6 is a cross-sectional view along a line VI-VI in FIG. 3.

As shown in FIG. 6, the supply line 18a and the return line 18b of each of the signal line sets DW1 to DW4 are disposed on the front surface and the back surface of an insulating sheet 18x made of polyimide or the like, so as to oppose each other through the insulating sheet 18x. Furthermore, on each of the front and back surfaces of the insulating sheet 18x, the supply lines 18a and the return lines 18b of the signal line sets DW1 to DW4 are arranged alternately.

Protection layers 18y for protecting the supply lines 18a and the return lines 18b are disposed on the front and back surfaces of the insulating sheet 18x.

As shown in FIG. 3, the driver IC19 has analog switches SW provided for each actuator 12x. The other end of the supply line 18a is connected to the switch SW. The other end of the return line 18b is connected to the common electrode 12b. Based on an IC control signal supplied from the IC control circuit F, the driver IC 19 selects one of the driving signals S1 to S4 by using the switches SW, and supplies the selected driving signal to the actuator 12x. Voltages based on the driving signals S1 to S4 supplied to the actuators 12x are applied to the individual electrodes 12d, which causes ink droplets having sizes corresponding to the driving signals S1 to S4 to be ejected from the nozzles 11n, or causes menisci of ink in the nozzles 11n to be vibrated.

Each of the insulating circuits I0 to I4 is provided between the control circuits 5x and the main power supply Vx and the circuit units U0 to U4. The insulating circuits I0 to I4 include photo couplers P0 to P4 and transformers T0 to T4. The photo couplers P0 to P4 serve as signal isolators and disposed between the control circuits 5x and the circuit units U0 to U4. The transformers (winding transformers, piezoelectric transformers, or the like) T0 to T4 serve as power supply isolators and disposed between the main power supply Vx and the primary sides of the subsidiary power supplies V1 to V4. The transformers T0 to T4 are an example of isolators according to this disclosure. The transformers T0 to T4 electrically isolate the main power supply Vx from the primary sides of the subsidiary power supplies V0 to V4. In this manner, the subsidiary power supplies V0 to V4 are isolated from the ground of the main power supply Vx, so that at least the amplifiers A1 to A4 are in an electrically floating state. Dotted lines in FIG. 3 indicate sections electrically separated by the insulating circuits I0 to I4.

The "primary side" is an upstream side (the main power supply Vx side) of a current, and the "secondary side" is a downstream side of a current (the head 1 side; the side at which a load is connected).

Figure 7:
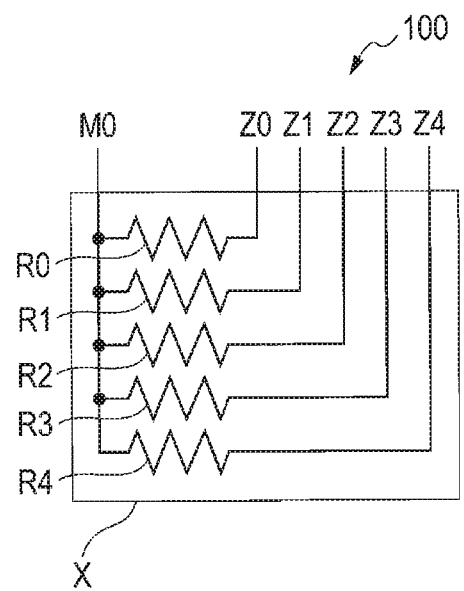
FIG. 7 is a circuit diagram showing a region VII in FIG. 3.

The connection circuit X is a circuit connecting a ground M0 of the main power supply Vx to secondary sides Z0 to Z4 of each of the subsidiary power supplies V0 to V4 and has a configuration shown in FIG. 7. More specifically, in the present embodiment, resistors R0 to R4 are provided between the ground M0 of the main power supply Vx and the secondary sides Z0 to Z4 of each of the subsidiary power supplies V0 to V4.

As described above, according to the present embodiment, as shown in FIG. 3, the four amplifiers A1 to A4 are provided, and the signal line sets DW1 to DW4 are provided for the amplifiers A1 to A4, respectively, so that the driving signals S1 to S4 amplified by each of the amplifiers A1 to A4 are supplied to the plurality of actuators 12x through the power supply lines 18a of the signal line sets DW1 to DW4 corresponding to the amplifiers. In this manner, the driving signals need not include pulse waveforms of a large number of types, and an ejection cycle is suppressed from being long. Since each of the amplifiers A1 to A4 is electrically floating, the absolute values of current waveforms of the supply line 18a and the return line 18b of each of the signal line sets DW1 to DW4 are equal to each other, thereby reducing the inductance.

The subsidiary power supplies V1 to V4 supplying electric power supplied from the main power supply Vx to the amplifiers A1 to A4, respectively, are provided for the amplifiers A1 to A4. In this case, due to the circuit configuration between the subsidiary power supplies V1 to V4 and the main power supply Vx, a state can be easily achieved in which the amplifiers A1 to A4 are electrically floating.

The transformers T1 to T4 (isolators) provided between the main power supply Vx and the primary sides of each of the subsidiary power supplies V1 to V4 electrically isolate the main power supply Vx from the primary sides of the subsidiary power supplies V1 to V4. In this case, since each of the subsidiary power supplies V1 to V4 is not configured to have isolators, the circuit units U1 to U4 including the subsidiary power supplies V1 to V4 and the amplifiers A1 to A4 can be downsized.

Since each of the amplifiers A1 to A4 is electrically floating, static electricity has nowhere to go and can be accumulated in each of the amplifiers A1 to A4. In this case, electrostatic discharge can cause a problem of generation of noise triggering an erroneous operation. With respect to this, according to the present embodiment, as shown in FIG. 7, resistors R1 to R4 are provided between the ground M0 of the main power supply Vx and the secondary sides Z1 to Z4 of the subsidiary power supplies V1 to V4 corresponding to each of the amplifiers A1 to A4, thereby grounding each of the subsidiary power supplies V1 to V4 through the resistors R1 to R4, so that static electricity can be prevented from being accumulated and generation of noise can be suppressed.

If the output capabilities (in the present embodiment, peak current output capabilities) of all the subsidiary power supplies V1 to V4 are matched with one of the driving signals S1 to S4 amplified by one of the four amplifiers A1 to A4 requiring the largest output capability (in the present embodiment, the small-droplet driving signal S1 having the largest peak current), the costs increase, and the circuit units U1 to U4 including the subsidiary power supplies V1 to V4 and the amplifiers A1 to A4 increase in size. In this regard, according to the present embodiment, the subsidiary power supplies V1 to V4 are assigned according to the waveforms of the driving signals S1 to S4 amplified by the amplifiers A1 to A4. More specifically, out of the subsidiary power supplies V1 to V4, the subsidiary power supplies (subsidiary power supplies V2 and V3) having the smallest peak current output capabilities are assigned to the amplifiers (amplifiers A2 and A3) amplifying the driving signals (medium-droplet driving signal S2 and large-droplet driving signal S3) having the smallest peak currents (degrees of steepness). Out of the subsidiary power supplies V1 to V4, the subsidiary power supply (subsidiary power supply V4) having the second smallest peak current output capability is assigned to the amplifier A4 amplifying the non-ejection driving signal S4 having a peak current (degree of steepness) smaller than the peak current of the small-droplet driving signal S1 and larger than the peak currents of the medium-droplet driving signal S2 and the large-droplet driving signal S3. In this manner, the above problem can be suppressed.

On each of the signal line sets DW1 to DW4, the supply line 18a and the return line 18b oppose each other, and the supply lines 18a and the return lines 18b of the signal line sets DW1 to DW4 are alternately arranged (see FIG. 6). In this manner, in both a direction of thickness of the insulating sheet 18x (the direction in which the supply line 18a and the return line 18b oppose each other in each of the signal line sets DW1 to DW4) and a direction along the insulating sheet 18x (the direction in which the signal line sets DW1 to DW4 are arranged), magnetic fields generated due to flows of the driving signals S1 to S4 are canceled out, and the inductance is reduced.

The head 1 has a common electrode 12b (ground electrode) common to the plurality of nozzles 11n. Because individual ground electrodes are not provided for the plurality of nozzles 11n and a ground electrode common to the plurality of nozzles 11n is provided, the configuration is simplified. Although the ground electrode common to the plurality of nozzles 11n is provided in the present embodiment, each of the amplifiers A1 to A4 is electrically floating. Thus, the driving signals S1 to S4 are returned to the corresponding amplifiers A1 to A4, respectively.

Second Embodiment

Next, a printer 200 according to a second embodiment of this disclosure will be described with reference to FIG. 8.

In the first embodiment, the connection circuit X has the configuration shown in FIG. 7. In the present embodiment, the connection circuit X has a configuration shown in FIG. 8. More specifically, in the present embodiment, the resistors R0 to R4 and capacitors C0 to C4 are arranged in parallel between the ground M0 of the main power supply Vx and the secondary sides Z0 to Z4 of each of the subsidiary power supplies V0 to V4.

Since each of the amplifiers A1 to A4 is electrically floating, noise causing an erroneous operation can be generated. In this regard, according to the present embodiment, the capacitors C1 to C4 are provided between the ground M0 of the main power supply Vx and the secondary sides Z1 to Z4 of the subsidiary power supplies V1 to V4 corresponding to each of the amplifiers A1 to A4, thereby securing a low impedance especially at a high frequency and suppressing noise from being generated.

Third Embodiment

Figure 9:
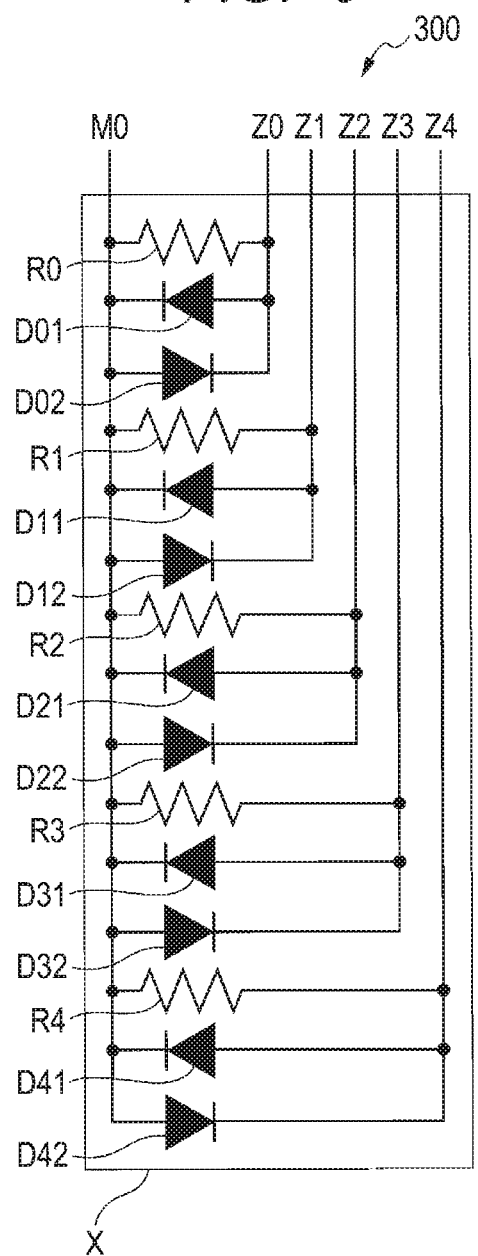
FIG. 9 is a circuit diagram showing a region VII in FIG. 3 in a printer 300 according to a third embodiment.

Next, a printer 300 according to a third embodiment of this disclosure will be described with reference to FIG. 9.

In the first embodiment, the connection circuit X has the configuration shown in FIG. 7. In the present embodiment, the connection circuit X has a configuration shown in FIG. 9. More specifically, in the present embodiment, the resistors R0 to R4 and a pair of diodes are arranged in parallel between the ground M0 of the main power supply Vx and the secondary sides Z0 to Z4 of each of the subsidiary power supplies V0 to V4. The pair of diodes has opposite rectifying directions. A pair of diodes D01 and D02 is connected in parallel with the resistor R0, a pair of diodes D11 and D12 is connected in parallel with the resistor R1, a pair of diodes D21 and D22 is connected in parallel with the resistor R2, a pair of diodes D31 and D32 is connected in parallel with the resistor R3, and a pair of diodes D41 and D42 is connected in parallel with the resistor R4.

Since each of the amplifiers A1 to A4 is electrically floating, voltage differences can be generated in the four subsidiary power supplies V1 to V4, and an overcurrent can be generated. In this regard, according to the present embodiment, the diodes are disposed between the ground M0 of the main power supply Vx and the secondary sides Z0 to Z4 of the subsidiary power supplies V1 to V4 corresponding to each of the amplifiers A1 to A4, thereby suppressing the voltage difference in the four subsidiary power supplies V1 to V4 and suppressing the overcurrent.

Fourth Embodiment

Figure 10:
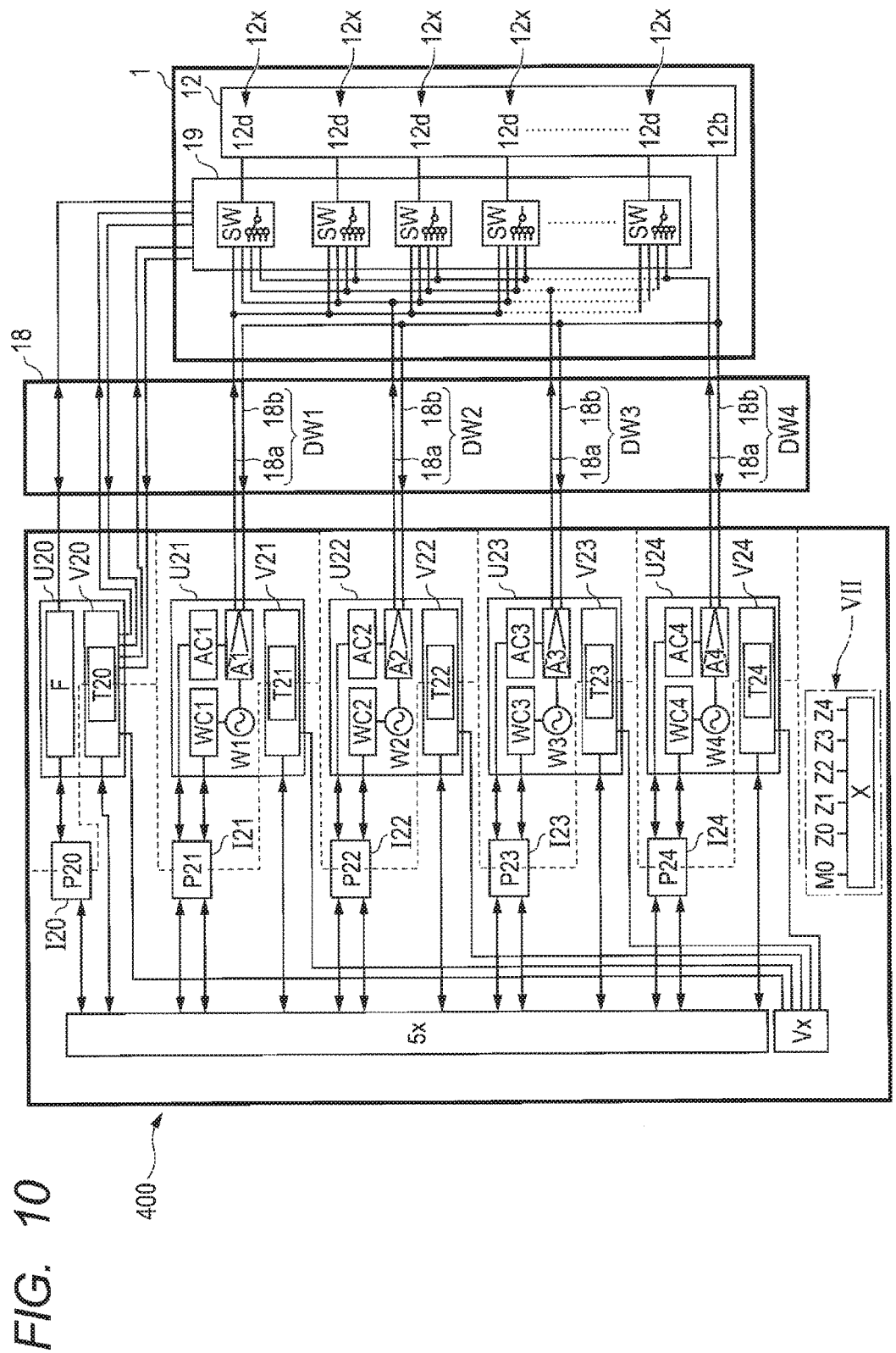
FIG. 10 is a circuit diagram showing an electric configuration of a printer 400 according to a fourth embodiment.

Next, a printer 200 according to a fourth embodiment of this disclosure will be described with reference to FIG. 10.

In the first embodiment, the transformers T1 to T4 as examples of isolators of this disclosure are provided between the main power supply Vx and the primary sides of the subsidiary power supplies V1 to V4. In the present embodiment, transformers T21 to T24 as examples of isolators of this disclosure are provided at subsidiary power supplies V21 to V24, respectively. A transformer T20 is provided at a subsidiary power supply V20 of a circuit unit U20 including the IC control circuit F.

The main power supply Vx is connected to the primary sides of each of the subsidiary power supplies V20 to V24. Each of the transformers T20 to T24 electrically isolates the primary side of each of the subsidiary power supplies V20 to V24 from the secondary side thereof. In this manner, the subsidiary power supplies V20 to V24 are isolated from the ground of the main power supply Vx, and the amplifiers A1 to A4 are electrically floating. Dotted lines in FIG. 8 indicate sections electrically separated by insulating circuits 120 to 124 and the transformers T21 to T24.

The insulating circuits 120 to 124 are provided between the control circuit 5x, the main power supply Vx and the circuit units U20 to U24, respectively. The insulating circuits 120 to 124 include photo couplers P20 to P24, respectively.

As in the first embodiment, the circuit units U21 to U24 include, in addition to the signal generating circuits W1 to W4 and the subsidiary power supplies V21 to V24, the amplifiers A1 to A4, the signal generating circuit controllers WC1 to WC4, and the amplifier controllers AC1 to AC4, respectively. Driving signals generated by the signal generating circuits W1 to W4 are amplified by the amplifiers A1 to A4 and then supplied to each of the switches SW of the driver IC 19 provided on the head 1 through the supply lines 18a of the signal line sets DW1 to DW4 provided on the FFC 18. The driver IC 19 selects one of the driving signals by using the switches SW, and the selected driving signal is supplied to each of the actuators 12x of the actuator unit 12. A voltage based on the driving signal supplied to the each of the actuators 12x is applied to each of the individual electrodes 12d. The common electrode 12b is maintained at a ground potential. The driving signals are returned to the corresponding amplifiers A1 to A4 through the return lines 18b of the signal line sets DW1 to DW4, respectively.

According to the present embodiment, since no isolators are disposed between the main power supply Vx and each of the subsidiary power supplies V21 to V24, spaces between the main power supply Vx and each of the subsidiary power supplies V21 to V24 can be reduced in size.

Furthermore, in the first embodiment, the subsidiary power supplies V1 to V4 are assigned to the amplifiers A1 to A4, respectively, such that the peak current output capabilities of the subsidiary power supplies V1 to V4 are suitable for the peak currents of the driving signals, respectively. In contrast to this, in the fourth embodiment, the subsidiary power supplies V21 to V24 are assigned to the amplifiers A1 to A4, respectively, such that the power output capabilities of the subsidiary power supplies V21 to V24 are suitable for the power consumptions of the driving signals, respectively. More specifically, out of the subsidiary power supplies V21 to V24, the subsidiary power supply V23 has the largest power output capability, and the subsidiary power supplies V21 and V22 have the smallest power output capabilities. That is, out of the subsidiary power supplies V21 to V24, the subsidiary power supplies (subsidiary power supplies V21 and V22) having the smallest output capabilities are assigned to the amplifiers (amplifiers A1 and A2) amplifying the driving signals (small-droplet driving signal S1 and medium-droplet driving signal S2) having the smallest power consumptions. Out of the subsidiary power supplies V21 to V24, the subsidiary power supply (subsidiary power supply V23) having the largest power output capability is assigned to the amplifier (amplifier A3) amplifying the driving signal (large-droplet driving signal S3) having the largest power consumption.

If the output capabilities (in the present embodiment, power output capabilities) of all the subsidiary power supplies V21 to V24 are matched with one waveform of the driving signals amplified by the four amplifiers A1 to A4 requiring the largest output capability (in the present embodiment, the large-droplet driving signal S3 having the largest power consumption), the costs increase, and the circuit units U21 to U24 including the subsidiary power supplies V21 to V24 and the amplifiers A1 to A4 increase in size. In this regard, according to the present embodiment, the subsidiary power supplies V21 to V24 are assigned according to the waveforms of the driving signals amplified by the amplifiers A1 to A4. More specifically, out of the subsidiary power supplies V21 to V24, the subsidiary power supplies (subsidiary power supplies V21 and V22) having the smallest peak current output capabilities are assigned to the amplifiers (amplifiers A1 and A2) amplifying the driving signals (small-droplet driving signal S1 and medium-droplet driving signal S2) having the smallest power consumptions (the smallest numbers of pulses). In this manner, the above problem can be suppressed.

While the disclosure has been described in detail with reference to the above aspects thereof, it would be apparent to those skilled in the art that various changes and modifications may be made therein without departing from the scope of the claims.

For example, each of the subsidiary power supplies may be connected to the main power supply as long as an ejection operation of a liquid ejection head is not affected. For example, an element (a resistor and so on) allowing a current smaller than 1% of a total current flowing in the circuit of the liquid ejecting apparatus to flow therethrough may be provided between each of the subsidiary power supplies and the main power supply. Such a case also corresponds to a state in which "each of a plurality of amplifiers is electrically floating" of this disclosure.

The isolators are not limited to transformers (winding transformers, piezoelectric transformers, and so on), and may be photo couplers, optical isolators converting energy by using LEDs, and so on.

Figure 8:
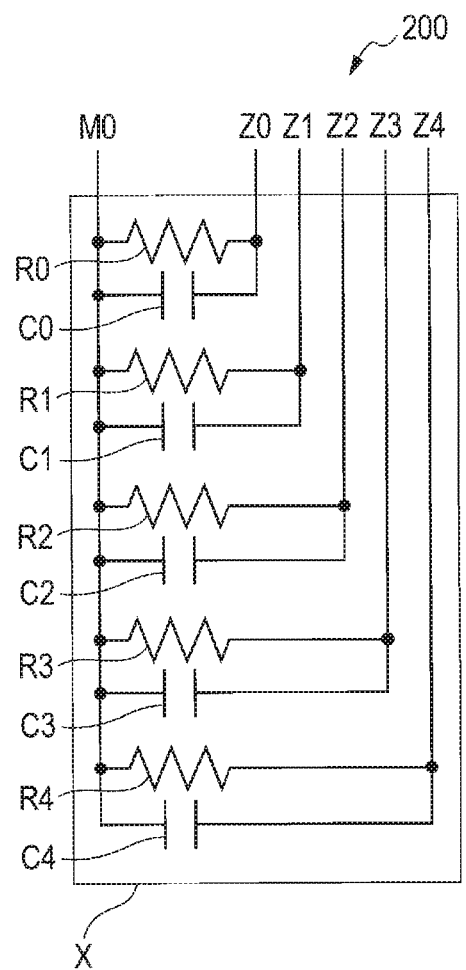
FIG. 8 is a circuit diagram showing a region VII in FIG. 3 in a printer 200 according to a second embodiment.

In the example in FIG. 8, resistors and capacitors are provided in parallel between the ground of the main power supply and the secondary sides of the plurality of subsidiary power supplies. However, only capacitors may be provided between the ground of the main power supply and the secondary sides of the plurality of subsidiary power supplies. Alternatively, capacitors and diodes may be provided in parallel between the ground of the main power supply and the secondary sides of the plurality of subsidiary power supplies.

The number of amplifiers may be two or more, and is not limited to four. The number of types of driving signals may be two or more, and is not limited to four.

The subsidiary power supplies need not be assigned to amplifiers such that the output capabilities (peak current output capabilities or power output capabilities) of the subsidiary power supplies are suitable for peak currents or power consumptions of driving signals. For example, the output capabilities of the subsidiary power supplies corresponding to the amplifiers may be equal to each other.

The signal line sets are not limited to a configuration in which the supply lines and the return lines oppose each other through an insulating sheet as shown in FIG. 6 or a configuration in which supply lines and return lines are alternately arranged on each of the front and back surfaces of insulating sheet. Further, each signal line set may include a plurality of systems of signal line sets, depending on electric power or the like.

The ground electrode may be provided for each nozzle. The actuator is not limited to an actuator of a piezoelectric type using a piezoelectric element as in the embodiments described above, and may be of another type (for example, a thermal type using a heater element, an electrostatic type using static electricity, and so on).

The liquid ejection head may be applied to not only a device of a line type but also a device of a serial type (for example, a type of ejecting ink from a head onto a recording medium conveyed in a conveyance direction, while scanning the head in a direction perpendicular to the conveyance direction). The liquid ejecting apparatus is not limited to an apparatus including a head unit including a plurality of liquid ejection heads, and may include a single liquid ejection head. The liquid ejected by the liquid ejection head is not limited to ink, and may be arbitrary liquid (for example, processing liquid aggregating or depositing components included in ink). The recording medium is not limited to a sheet of paper, and may be an arbitrary recordable medium (for example, cloth). This disclosure can be applied to not only a printer, but also a facsimile machine, a copying machine, a multifunction peripheral, and so on.

What is claimed is:

1. A liquid ejecting apparatus comprising:
   a liquid ejection head having a plurality of actuators;
   a plurality of amplifiers configured to amplify driving signals supplied to each of the plurality of actuators; and
   a plurality of signal line sets provided for respective ones of the plurality of amplifiers, each of the plurality of signal line sets including:
      a supply line configured to supply the driving signals amplified by a corresponding one of the plurality of amplifiers to the plurality of actuators; and
      a return line configured to return the driving signals to the corresponding one of the plurality of amplifiers,
   each of the plurality of amplifiers being electrically floating.

2. The liquid ejecting apparatus according to claim 1, further comprising:
   a main power supply of the liquid ejecting apparatus; and
   a plurality of subsidiary power supplies provided for the respective ones of the plurality of amplifiers, the plurality of subsidiary power supplies being configured to supply electric power supplied from the main power supply to the respective ones of the plurality of amplifiers.

3. The liquid ejecting apparatus according to claim 2, wherein the main power supply is connected to ground; and
   wherein each of the plurality of subsidiary power supplies is isolated from the ground of the main power supply.

4. The liquid ejecting apparatus according to claim 2, further comprising:
   a plurality of isolators provided between the main power supply and primary sides of respective ones of the plurality of subsidiary power supplies, the plurality of isolators being configured to electrically isolate the main power supply from the primary sides of the respective ones of the plurality of subsidiary power supplies.

5. The liquid ejecting apparatus according to claim 2, further comprising:
   a plurality of isolators provided at respective ones of the plurality of subsidiary power supplies, the plurality of isolators being configured to electrically isolate primary sides of the respective ones of the plurality of subsidiary power supplies from secondary sides thereof.

6. The liquid ejecting apparatus according to claim 2, further comprising:
   a plurality of resistors provided between ground of the main power supply and a secondary side of respective ones of the plurality of subsidiary power supplies.

7. The liquid ejecting apparatus according to claim 2, further comprising:
   a plurality of capacitors provided between ground of the main power supply and a secondary side of respective ones of the plurality of subsidiary power supplies.

8. The liquid ejecting apparatus according to claim 2, further comprising:
a plurality of diodes provided between ground of the main power supply and a secondary side of respective ones of the plurality of subsidiary power supplies.

9. The liquid ejecting apparatus according to claim 2, wherein the plurality of amplifiers amplifies the driving signals having waveforms different from each other; and
wherein the plurality of subsidiary power supplies has output capabilities different from each other, and is assigned depending on the waveforms of the driving signals amplified by the plurality of amplifiers.

10. The liquid ejecting apparatus according to claim 9, wherein the plurality of subsidiary power supplies has peak current output capabilities different from each other;
wherein the driving signals amplified by the plurality of amplifiers have peak currents different from each other; and
wherein a subsidiary power supply having a smallest peak current output capability, out of the plurality of subsidiary power supplies, is assigned to an amplifier that amplifies the driving signals having a smallest peak current, out of the plurality of amplifiers.

11. The liquid ejecting apparatus according to claim 10, wherein rising and falling of waveforms of the driving signals amplified by the plurality of amplifiers have degrees of steepness different from each other;
wherein the driving signals include:
a small-droplet driving signal for ejecting a small droplet; and
a large-droplet driving signal for ejecting a large droplet having a larger ejection amount than the small droplet, the large-droplet driving signal having a smaller degree of steepness than the small-droplet driving signal; and
wherein a subsidiary power supply having a smallest peak current output capability, out of the plurality of subsidiary power supplies, is assigned to an amplifier that amplifies the large-droplet driving signal out of the plurality of amplifiers.

12. The liquid ejecting apparatus according to claim 11, wherein the driving signals amplified by the plurality of amplifiers further include a non-ejection driving signal for ejecting no liquid droplet, the non-ejection driving signal having a degree of steepness that is smaller than the degree of steepness of the small-droplet driving signal and that is larger than the degree of steepness of the large-droplet driving signal; and
wherein a subsidiary power supply having a second smallest peak current output capability out of the plurality of subsidiary power supplies is assigned to an amplifier that amplifies the non-ejection driving signal out of the plurality of amplifiers.

13. The liquid ejecting apparatus according to claim 9, wherein the plurality of subsidiary power supplies has electric power output capabilities different from each other;
wherein the driving signals amplified by the plurality of amplifiers have power consumptions different from each other; and
wherein a subsidiary power supply having a smallest electric power output capability, out of the plurality of subsidiary power supplies, is assigned to an amplifier that amplifies the driving signals having a smallest power consumption out of the plurality of amplifiers.

14. The liquid ejecting apparatus according to claim 13, wherein the driving signals amplified by the plurality of amplifiers have numbers of pulses different from each other;
wherein the driving signals include:
a small-droplet driving signal for ejecting a small droplet; and
a large-droplet driving signal for ejecting a large droplet having a larger ejection amount than the small droplet, the large-droplet driving signal having a larger number of pulses than the small-droplet driving signal; and
wherein a subsidiary power supply having a smallest electric power output capability, out of the plurality of subsidiary power supplies, is assigned to an amplifier that amplifies the small-droplet driving signal out of the plurality of amplifiers.

15. The liquid ejecting apparatus according to claim 2, wherein the plurality of subsidiary power supplies comprises:
a first subsidiary power supply provided for a first amplifier that amplifies a small-droplet driving signal for ejecting a small droplet;
a second subsidiary power supply provided for a second amplifier that amplifies a medium-droplet driving signal for ejecting a medium droplet having a larger ejection amount than the small droplet;
a third subsidiary power supply provided for a third amplifier that amplifies a large-droplet driving signal for ejecting a large droplet having a larger ejection amount than the medium droplet; and
a fourth subsidiary power supply provided for a fourth amplifier that amplifies a non-ejection driving signal for ejecting no liquid droplet;
wherein the medium-droplet driving signal has a smaller degree of steepness than the small-droplet driving signal;
wherein the large-droplet driving signal has a larger number of pulses than the medium-droplet driving signal and has a same degree of steepness as the medium-droplet driving signal; and
wherein the non-ejection driving signal has a degree of steepness that is smaller than the degree of steepness of the small-droplet driving signal and that is larger than the degree of steepness of the large-droplet driving signal.

16. The liquid ejecting apparatus according to claim 1, wherein the supply line and the return line oppose each other in each of the plurality of signal line sets; and
wherein the supply line and the return line of the plurality of signal line sets are arranged alternately.

17. The liquid ejecting apparatus according to claim 1, wherein the liquid ejection head has a plurality of nozzles and a ground electrode common to the plurality of nozzles.

18. The liquid ejecting apparatus according to claim 1, wherein the supply line and the return line of each of the plurality of signal line sets are disposed on a front surface and a back surface of an insulating sheet, so as to oppose each other through the insulating sheet; and
wherein, on each of the front surface and the back surface of the insulating sheet, the supply line and the return line of the plurality of signal line sets are arranged alternately.

* * * * *